United States Patent
Kang et al.

(10) Patent No.: US 10,900,142 B2
(45) Date of Patent: Jan. 26, 2021

(54) APPARATUS FOR MANUFACTURING A SECOND SUBSTRATE ON A FIRST SUBSTRATE INCLUDING REMOVAL OF THE FIRST SUBSTRATE

(71) Applicant: SAMSUNG ELECTRONICS CO., LTD., Suwon-si (KR)

(72) Inventors: Sam-mook Kang, Hwaseong-si (KR); Jun-youn Kim, Hwaseong-si (KR); Young-jo Tak, Hwaseong-si (KR); Mi-hyun Kim, Seoul (KR); Young-soo Park, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 491 days.

(21) Appl. No.: 15/641,746

(22) Filed: Jul. 5, 2017

(65) Prior Publication Data
US 2018/0030617 A1 Feb. 1, 2018

(30) Foreign Application Priority Data
Jul. 26, 2016 (KR) .......................... 10-2016-0094831

(51) Int. Cl.
*C30B 25/16* (2006.01)
*H01L 21/687* (2006.01)
(Continued)

(52) U.S. Cl.
CPC ............ *C30B 25/165* (2013.01); *C23C 16/01* (2013.01); *C23C 16/0272* (2013.01);
(Continued)

(58) Field of Classification Search
CPC ......... H01L 21/68721; H01L 21/68735; H01L 21/0254; H01L 21/7806; C30B 25/12;
(Continued)

(56) References Cited

U.S. PATENT DOCUMENTS 4,738,618 A * 4/1988 Massey .................. C30B 35/00
414/940
5,326,725 A * 7/1994 Sherstinsky .......... C23C 16/042
118/500
(Continued)

FOREIGN PATENT DOCUMENTS

JP        11-092941 A      6/1999
KR     10-0777467 B1     11/2007
(Continued)

OTHER PUBLICATIONS

Druminski, et al. "Selective Etching and Epitaxial Refilling of Silicon Wells in the System $SiH_4/HCl/H_2$," Journal of Crystal Growth 31 (1975) pp. 312-316.

*Primary Examiner* — Charlee J. C. Bennett
(74) *Attorney, Agent, or Firm* — Lee IP Law, PC

(57) ABSTRACT

An apparatus includes a deposition chamber housing that accommodates a growth substrate, a supply nozzle to supply a deposition gas for forming a target large-size substrate on the growth substrate into the deposition chamber housing, a susceptor to support the growth substrate and expose a rear surface of the growth substrate to an etch gas, and an inner liner connected to the susceptor. The inner liner is to isolate the etch gas from the deposition gas and guide the etch gas toward the rear surface of the growth substrate. The susceptor includes a center hole that exposes the rear surface of the growth substrate and a support protrusion supporting the growth substrate, the support protrusion protruding toward the center of the center hole from an inner sidewall of the susceptor defining the center hole.

20 Claims, 17 Drawing Sheets

(51) Int. Cl.
| | |
|---|---|
| H01J 37/32 | (2006.01) |
| C23C 16/52 | (2006.01) |
| C30B 25/14 | (2006.01) |
| C30B 25/12 | (2006.01) |
| C23C 16/455 | (2006.01) |
| C23C 16/02 | (2006.01) |
| C23C 16/458 | (2006.01) |
| C23C 16/01 | (2006.01) |
| C23C 16/30 | (2006.01) |
| C30B 25/18 | (2006.01) |
| C30B 29/40 | (2006.01) |
| H01L 21/02 | (2006.01) |
| H01L 21/78 | (2006.01) |

(52) U.S. Cl.
CPC .......... *C23C 16/303* (2013.01); *C23C 16/455* (2013.01); *C23C 16/4585* (2013.01); *C23C 16/52* (2013.01); *C30B 25/12* (2013.01); *C30B 25/14* (2013.01); *C30B 25/183* (2013.01); *C30B 29/406* (2013.01); *H01J 37/3244* (2013.01); *H01J 37/32403* (2013.01); *H01J 37/32449* (2013.01); *H01J 37/32513* (2013.01); *H01J 37/32715* (2013.01); *H01L 21/68721* (2013.01); *H01L 21/68735* (2013.01); *H01L 21/0254* (2013.01); *H01L 21/7806* (2013.01)

(58) Field of Classification Search
CPC ..... C30B 25/14; C30B 25/165; C30B 25/183; C30B 29/406; C23C 14/54; C23C 16/455; C23C 16/4585; C23C 16/52; C23C 16/01; C23C 16/0272; C23C 16/303; H01J 37/32403; H01J 37/32449; H01J 37/32477; H01J 37/3244; H01J 37/32513; H01J 37/32715
USPC ................... 118/715–733; 156/345.1–345.55
See application file for complete search history.

(56) References Cited

U.S. PATENT DOCUMENTS

| | | | |
|---|---|---|---|
| 5,527,393 A | 6/1996 | Sato et al. | |
| 5,679,152 A | 10/1997 | Tischler et al. | |
| 6,372,608 B1 | 4/2002 | Shimoda et al. | |
| 6,645,830 B2 | 11/2003 | Shimoda et al. | |
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 1/2008 | Han et al. | |
| 7,332,031 B2 | 2/2008 | Tischler et al. | |
| 7,432,209 B2 | 10/2008 | Delgadino et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,871,845 B2 | 1/2011 | Yoon et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 8,969,178 B2 | 3/2015 | Lee et al. | |
| 2006/0014383 A1 | 1/2006 | Otsuki et al. | |
| 2006/0273324 A1 | 12/2006 | Asai et al. | |
| 2007/0026148 A1* | 2/2007 | Arai | C30B 25/14 427/248.1 |
| 2007/0247779 A1* | 10/2007 | Nakamura | H01L 21/6831 361/234 |
| 2008/0066684 A1* | 3/2008 | Patalay | H01L 21/68735 118/728 |
| 2009/0239362 A1* | 9/2009 | Hirata | C23C 16/4584 438/509 |
| 2010/0288728 A1* | 11/2010 | Han | H01J 37/3244 216/41 |
| 2012/0055406 A1* | 3/2012 | Hirata | C23C 16/4585 118/725 |
| 2013/0183815 A1* | 7/2013 | Sanchez | H01L 21/28556 438/478 |
| 2013/0183834 A1* | 7/2013 | Rogers | C23C 16/00 438/788 |
| 2016/0293398 A1* | 10/2016 | Danek | C23C 16/45527 |

FOREIGN PATENT DOCUMENTS

| | | |
|---|---|---|
| KR | 10-1034667 B1 | 5/2011 |
| KR | 10-2014-0036412 A | 3/2014 |

* cited by examiner

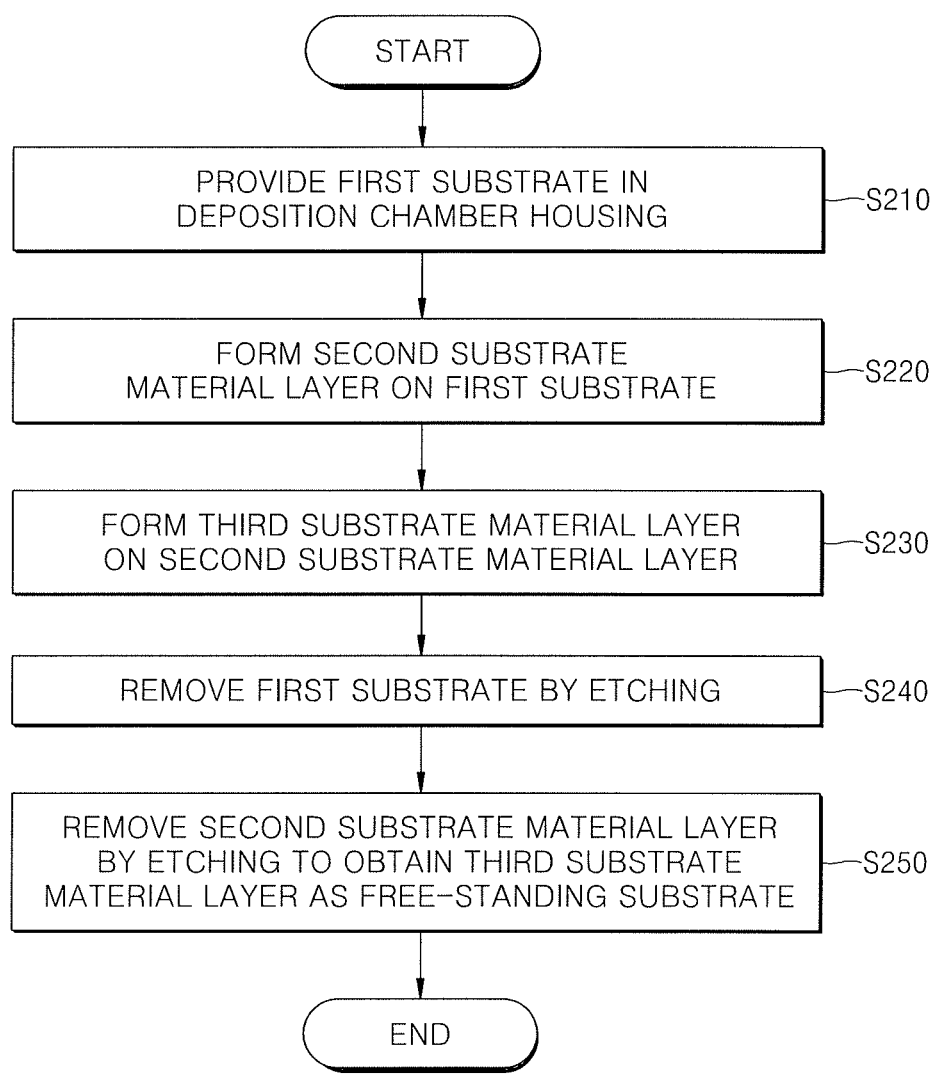

APPARATUS FOR MANUFACTURING A SECOND SUBSTRATE ON A FIRST SUBSTRATE INCLUDING REMOVAL OF THE FIRST SUBSTRATE

CROSS-REFERENCE TO RELATED APPLICATION

Korean Patent Application No. 10-2016-0094831, filed on Jul. 26, 2016, in the Korean Intellectual Property Office, and entitled: "Apparatus of Manufacturing Large-Size Substrate," is incorporated by reference herein in its entirety.

BACKGROUND

1. Field

Embodiments relate to an apparatus for manufacturing a substrate, and more particularly, to an apparatus for manufacturing a second substrate on a first substrate while removing the first substrate either after or during the formation of the second substrate.

2. Description of the Related Art

Sapphire substrates are widely used to manufacture gallium nitride substrates, but are costly and difficult to manufacture in a large size. Silicon substrates have been suggested as an alternative, but suffer issues, e.g., stress and consequential damage due to the difference of coefficient of thermal expansion between the silicon substrate and gallium nitride substrate.

SUMMARY

One or more embodiments is directed to an apparatus a deposition chamber housing that accommodates a growth substrate; a supply nozzle to supply a deposition gas for forming a target large-size substrate on the growth substrate into the deposition chamber housing; a susceptor to support the growth substrate and to expose a rear surface of the growth substrate to an etch gas; and an inner liner connected to the susceptor, wherein the inner liner isolates the etch gas from the deposition gas and guides the etch gas toward the rear surface of the growth substrate, wherein the susceptor includes a center hole, which exposes the rear surface of the growth substrate, and a support protrusion supporting the growth substrate, the support protrusion protruding toward the center of the center hole from an inner sidewall of the susceptor defining the center hole.

One or more embodiments is directed to an apparatus including: a deposition section in which a deposition gas is supplied to deposit a second substrate material layer on a first substrate included in the deposition section; an etching section in which an etch gas is supplied to remove the first substrate by etching; a support unit between the deposition section and the etching section, wherein the support unit supports the first substrate; and a controller that controls the deposition of the second substrate material layer and the etching of the first substrate, wherein the controller initiates the supply of the deposition gas prior to initiating the supply the etching gas, and the supplying of the deposition gas and the supplying of the etching gas at least partially overlap.

One or more embodiments is directed to an apparatus including a support to support a first substrate, the support exposing a top surface and a rear surface of the first substrate, a deposition section in which a deposition gas is supplied to deposit a second substrate material layer on the top surface of the first substrate, an etching section in which an etch gas is supplied to remove the first substrate by etching the rear surface of the first substrate, and an isolation section to isolate the etch gas from the deposition gas.

BRIEF DESCRIPTION OF THE DRAWINGS

Features will become apparent to those of skill in the art by describing in detail exemplary embodiments with reference to the attached drawings in which:

FIG. 14 illustrates a flowchart of a method of manufacturing a free-standing substrate, according to another embodiment.

DETAILED DESCRIPTION

Figure 1:
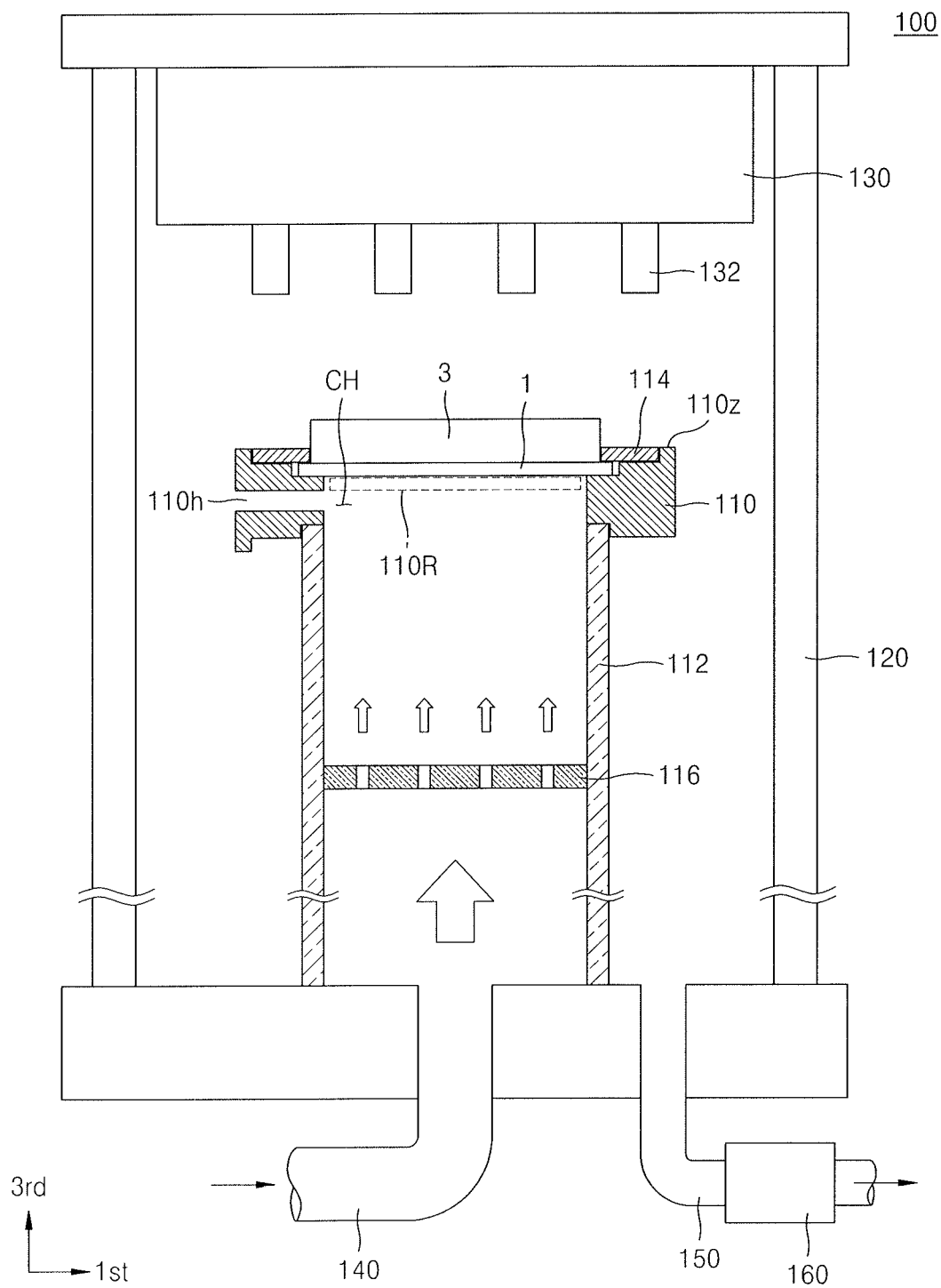
FIG. 1 illustrates a schematic view of a substrate manufacturing apparatus of manufacturing a large-size substrate, according to an embodiment.

FIG. 1 is a schematic view of a substrate manufacturing apparatus 100 of manufacturing a large-size substrate, according to an embodiment. Referring to FIG. 1, a growth substrate 1 may be accommodated into a deposition chamber housing 120. A target material layer 3 may be formed on the growth substrate 1.

The growth substrate 1 may be, for example, a sapphire substrate, a silicon substrate, a gallium arsenide (GaAs) substrate, a silicon carbide (SiC) substrate, an indium phosphide (InP) substrate, a magnesium oxide (MgO) substrate, a magnesium aluminate ($MgAl_2O_4$) substrate, a lithium aluminate ($LiAlO_2$) substrate, or a lithium gallium oxide ($LiGaO_2$) substrate. For example, to form a large-area target material layer 3, a silicon substrate that costs comparatively low and may be manufactured easily may be used.

An embodiment of using a silicon substrate having a diameter of about 4 inches (about 10.26 cm) or greater, for example, from about 4 inches to about 18 inches, as the growth substrate 1 will be described. However, it will be understood by one of ordinary skill in the art that the growth substrate 1 may have a smaller diameter than as described above and that the growth substrate 1 may be a substrate made of a different material from silicon. The growth substrate 1 may have a thickness of about 0.1 mm to about 1 mm. When the thickness of the growth substrate 1 is too thin, the growth substrate 1 may have insufficient mechanical strength. When the thickness of the growth substrate is too high, a further etching process may take a long time, resulting in reduced productivity.

A material of the target material layer 3 formed on the growth substrate 1 may be the same as a material of a target substrate to be manufactured as a free-standing substrate. For example, the target material layer 3 may include a Group III nitride, e.g., indium aluminum gallium nitride ($In_xAl_yGa_{1-x-y}N$ (wherein $0 \leq x \leq 1$ and $0 \leq y \leq 1$)). For example, the material of target material layer 3 may be gallium nitride (GaN), aluminum nitride (AlN), aluminum gallium nitride (AlGaN), or indium gallium nitride (InGaN).

The target material layer 3 may be formed on the growth substrate 1 by using any appropriate method selected from, for example, hydride vapor phase epitaxy (HVPE), metal organic vapor phase epitaxy (MOVPE), chemical vapor deposition (CVD), and molecular beam epitaxy (MBE).

Before the formation of the target material layer 3, a buffer layer may be formed on the growth substrate 1, if needed. The buffer layer may be formed of a material having a lattice constant similar to that of the target material layer 3 formed on the growth substrate 1. The buffer layer may be provided to prevent melt-back. Melt-back refers to the diffusion and incorporation of the material of the growth substrate 1 into the target material layer 3 when the material of the growth substrate 1 directly contacts the target material layer 3 during growth of the target material layer 3 on the growth substrate 1.

The buffer layer may be formed of, for example, one of AlN, tantalum nitride (TaN), titanium nitride (TiN), hafnium nitride (HfN), GaN, and AlGaN, or a triple layer of AlN/AlGaN/GaN. The buffer layer may have a thickness of, for example, about 5 nm to about 50 μm. The buffer layer may be for epitaxial growth of a GaN layer thereon. In some embodiments, the buffer layer may be formed using organic chemical vapor deposition (MOCVD).

As illustrated in FIG. 1, as an edge portion of the growth substrate 1 may be covered by a susceptor cover 114, the diameter of the growth substrate 1 may not match the diameter of the target material layer 3, e.g., may be greater than the target material layer 3. In other words, the susceptor cover 114 may overlap the edge portion of the growth substrate 1 in a third direction and may abut sidewalls of the target material layer 3.

The growth substrate 1 may be supported by a susceptor 110. The susceptor 110 may support the growth substrate 1 and, at the same time, expose a rear surface of the growth substrate 1 to an etch gas. The susceptor 110 may have an annular shape with a center hole CH. The growth substrate 1 supported by the susceptor 110 may be exposed to an etch gas through the center hole CH. The etch gas may be, e.g., a chlorine ($Cl_2$) gas, a hydrogen chloride (HCl) gas, or the like. However, embodiments are not limited thereto.

The susceptor cover 114 may be provided on the susceptor 110. The susceptor cover 114 may prevent deposition of a deposition material on the susceptor 110. The susceptor 110 may have a protruding portion 110z along an outer upper surface edge thereof extending in the third direction and planar with a top surface of the susceptor cover 114, such that not all of an upper surface of the susceptor 110 is covered by the susceptor cover 114, In some embodiments, the susceptor 110 may be supported by an inner liner 112. The inner liner 112 may be bound to a lower portion of the susceptor 110, and may separate an etching atmosphere inside a boundary established by the inner liner 112 from a deposition atmosphere outside the inner liner 112. The inner liner 112 may guide the flow of an etch gas supplied from outside through a supply line 140 to a rear surface of the growth substrate 1. The etch gas may react with the growth substrate 1 in an etching reaction zone 110R created near the rear surface of the growth substrate 1 and gradually remove the growth substrate 1.

An etching product gas produced through the etching reaction may be discharged out of the inner liner 112 through an outlet port 110h of the susceptor 110.

A diffusion plate 116 may be further provided within the inner liner 112. The diffusion plate 116 may render an etch gas to be uniformly distributed throughout the etching atmosphere surrounded by the inner liner 112 and be supplied uniformly to the entire rear surface of the growth substrate 1.

A gas supply unit 130 for supplying a deposition gas used to form the target material layer 3, and gas nozzles 132 may be provided above the growth substrate 1. A precursor gas of a target material, a carrier gas, a reactant gas, a purge gas, and the like may be simultaneously or sequentially supplied through the gas supply unit 130 and the gas nozzles 132.

Any remaining gas left unused to form the target material layer 3 and gas discharged out of the inner liner 112 through the outlet port 110h may be discharged out of the substrate manufacturing apparatus 100 through a discharge line 150. These gases may be discharged out of the substrate manufacturing apparatus 100 through a filter 160 for capturing solid foreign materials such as particles.

The deposition reaction and the etching reaction may be sequentially or simultaneously performed. In some embodiments, the etching reaction may be started after a portion of the deposition reaction takes place so that the target material layer 2 may be partly formed. The etching reaction may be continued until the growth substrate 1 is completely removed.

In FIG. 1, the susceptor 110 and the inner liner 112 may define an etching section. An inner space of the deposition chamber housing 120 outside the etching section may be defined as a deposition section. The growth substrate 1 may be placed between the deposition section and the etching section.

The growth substrate 1, e.g., a silicon substrate, and the target material layer 3, e.g., a GaN material layer, to grow on the growth substrate 1 may have a large difference in lattice constant and thermal expansion coefficient, so that the target material layer 3 may be cracked if the growth substrate 1 and the target material layer 3 are cooled at the same time, due to considerable stress exerting thereon. Accordingly, by removing the growth substrate 1 during or immediately after the formation of the target material layer 3, a free-standing substrate as the target material layer 3 without defect such as a crack may be obtained.

Figure 2:
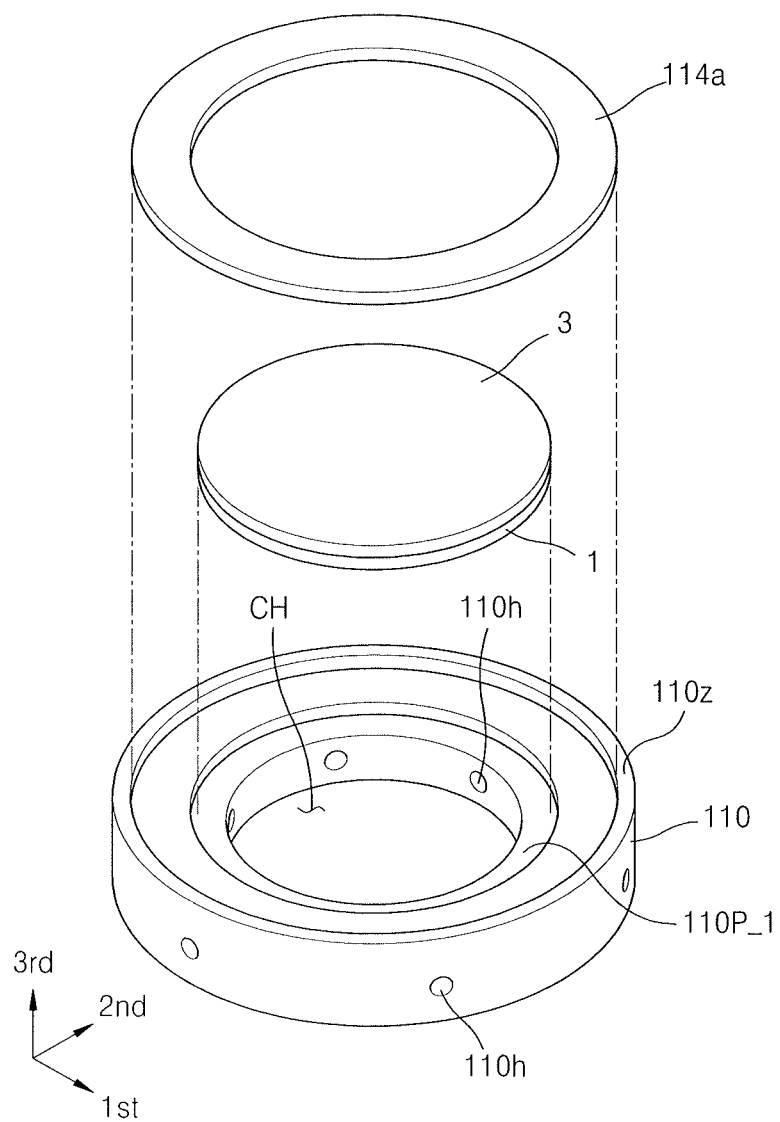
FIG. 2 illustrates a detailed exploded perspective view of a combination relationship of a susceptor, a susceptor cover, and substrates according to another embodiment.
Figure 3:
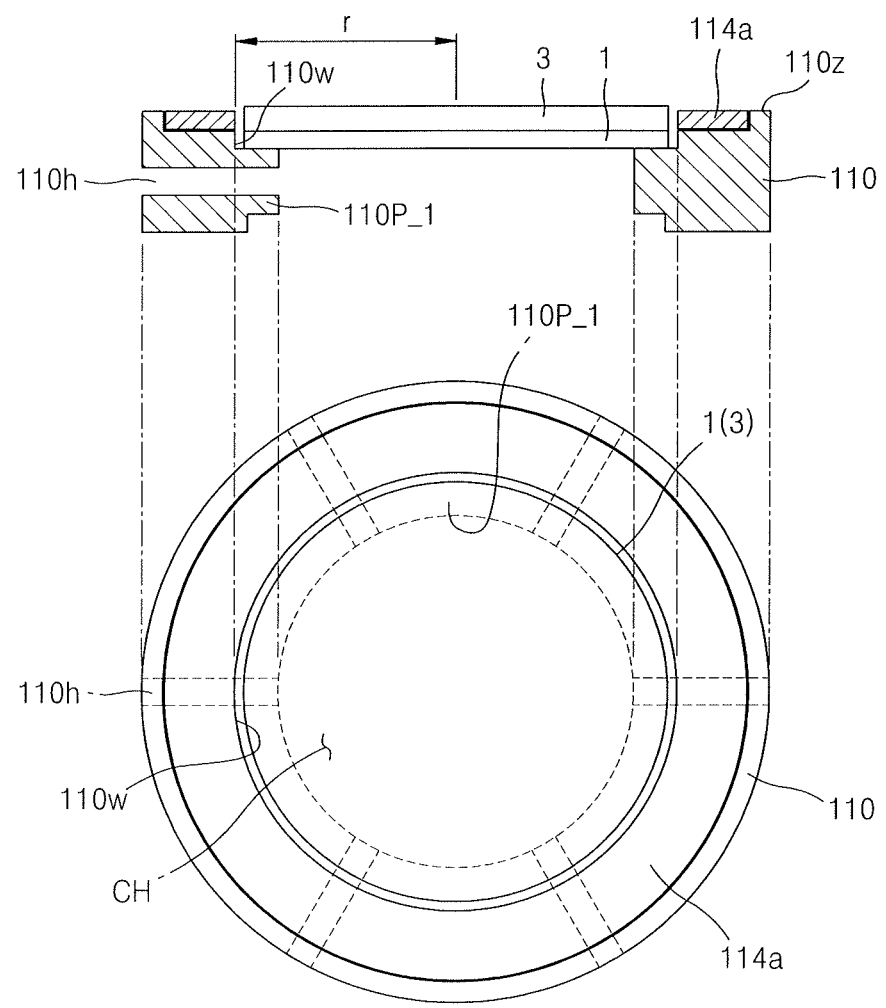
FIG. 3 illustrates a vertical cross-sectional view and a plan view of the combination relationship of the susceptor, the susceptor cover, and the substrates of FIG. 2 in greater detail.

FIG. 2 is a detailed exploded perspective view illustrating a combination relationship of the susceptor 110, a susceptor cover 114a, and substrates 1 and 3 according to another embodiment. FIG. 3 illustrates a vertical cross-sectional view and a plan view illustrating the combination relationship of the susceptor 110, the susceptor cover 114a, and the substrates 1 and 3 in greater detail. As shown therein, unlike in FIG. 1, the substrates 1 and 3 may have the same diameter and the susceptor cover may not overlap the substrate 1.

Referring to FIGS. 2 and 3, the susceptor 110 may have a center hole CH at the center thereof. The growth substrate 1 may be etched as an etch gas contacts the growth substrate 1 through the center hole CH. To discharge an etching product gas resulting from the etching out of the inner liner 112 (see FIG. 1) through the outlet port 110h, the outlet port 110h may extend through from an inner sidewall 110w of the susceptor 110 to an outer sidewall thereof.

The susceptor 110 may include a support protrusion 110P_1 that protrudes toward the center hole CH along the circumference of the inner sidewall 110w. As illustrated in FIG. 3, the growth substrate 1 and the target material layer 3 may be substantially supported by the support protrusion 110P_1.

A portion of the support protrusion 110P_1 that overlaps the growth substrate 1 along a third direction may be about 25% or less of a total area of the growth substrate 1, and in some embodiments, about 5% or less, and in some other embodiments, about 3% or less, and in some other embodiments, about 1% or less of the total area of the growth substrate 1. In other words, the support protrusion 110P_1 may be about 25% or less of the total area of the center hole CH and the support protrusions, e.g., $\pi r^2$, where r is the radius from a center of the center hole CH to an edge of the support protrusions away from the center hole CH, e.g., at the inner sidewall 110w. As noted in additional embodiments discussed below, when these protrusions only intermittently protrude toward the center hole CH and/or provide a non-planar contact surface for the growth substrate 1, this overlap and, especially, the contact area between the support protrusion(s) may be further reduced.

In FIGS. 2 and 3, the support protrusion 110P_1 is illustrated as extending along the entire circumference of the inner sidewall 110w of the susceptor 110. In some embodiments, the support protrusion 110P_1 may extend intermittently along the circumference of the inner sidewall 110w of the susceptor 110. After the growth substrate 1 is completely etched by an etch gas, only the target material layer 3 as a free-standing substrate may be supported on the support protrusion 110P_1.

Figure 4A:
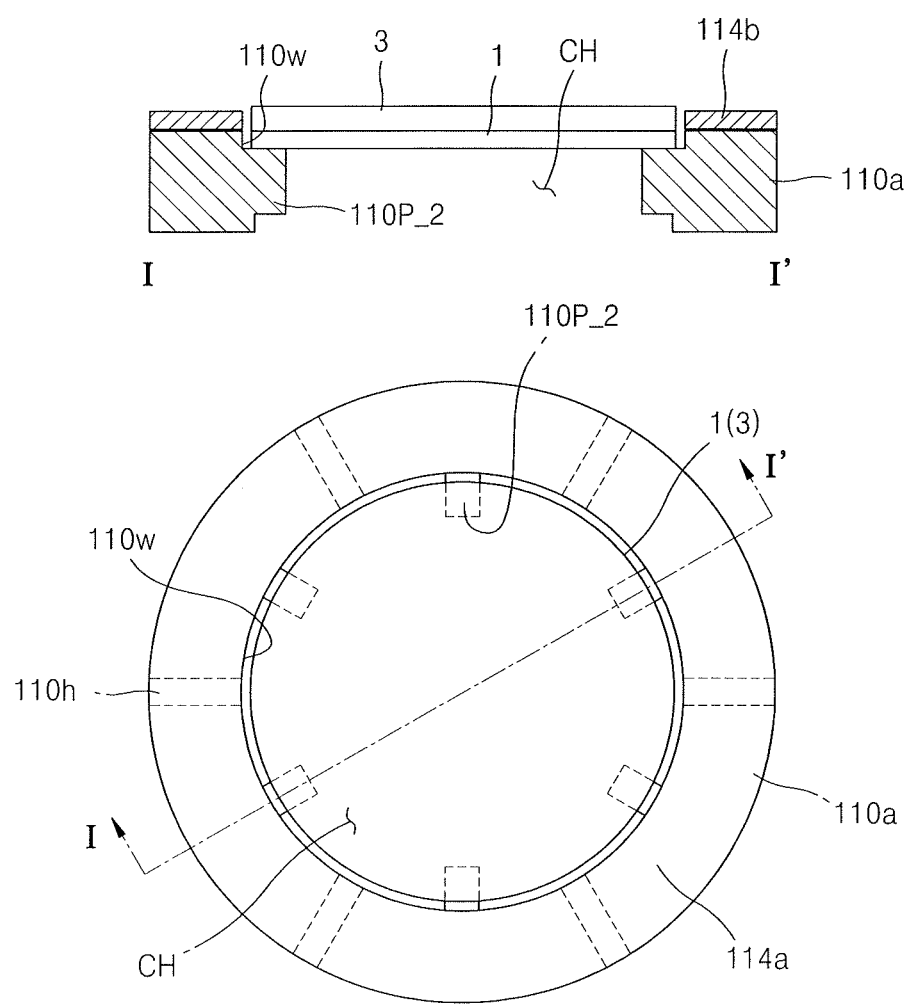
FIG. 4A illustrates a vertical cross-sectional view and a plan view illustrating a combination relationship of a susceptor, a susceptor cover, and substrates in greater detail, according to another embodiment.

FIG. 4A illustrates a vertical cross-sectional view and a plan view of a combination relationship of a susceptor 110a, a susceptor cover 114b, and substrates 1 and 3 in greater detail, according to another embodiment.

Referring to FIG. 4A, the susceptor 11a may include support protrusions 110P_2 having a pillar shape that protrude and extend intermittently along the circumference of the inner sidewall 110w of the susceptor 110 towards the center hole CH3 from the inner sidewall 110W, instead of the support protrusion 110P_1 extending along an entirety of the circumference of the inner sidewalls 110w.

The number of the support protrusions 110P_2 may be chosen to be appropriate to support the substrates 1 and 3, e.g., in consideration of a size, weight, and so forth. For example, the number of the support protrusions 110P_2 may be three or more, and in some embodiments, 10 or more. Further, while the support protrusions 110P_2 are illustrated to be regularly spaced along the circumference of the inner sidewall 110w of the susceptor 110, they may be irregularly spaced.

In FIG. 4A, the vertical cross-sectional view is taken along line I-I' of the plan view. That is, in the vertical cross-sectional view of FIG. 4A, the support protrusions 110P_2 as shown protrude from the opposite inner sidewalls 110w. As illustrated in the plan view of FIG. 4A, a plurality of outlet ports 110h may be arranged at predetermined locations. In some embodiments, the outlet ports 110h may be arranged at a regular interval along a circumferential direction, e.g., midway between adjacent support protrusions 110P_2. In some other embodiments, the outlet ports 110h may be arranged at irregular intervals along the circumferential direction.

As illustrated in FIG. 4A, the growth substrate 1 and the target material layer 3 may be substantially supported by the support protrusions 110P_2.

As in the embodiment of FIG. 3, after the growth substrate 1 is completely etched by an etch gas, only the target material layer 3 may remain as a free-standing substrate supported by the plurality of support protrusions 110P_2. In the embodiment of FIG. 4A, the etch gas may directly reach an edge region of the growth substrate 1, except for only small parts of the edge region that contact the support protrusions 110P_2, so that the growth substrate 1 may be more rapidly removed. The portions of the growth substrate 1 in contact with the support protrusions 110P_2 and protected from the etching are so small that the remaining stress due to differences in thermal expansion coefficients between the target material layer 3 and the growth substrate 1 may be reduced or minimized.

In the embodiments of FIGS. 2 and 3, the susceptor 110 may have the protruding portion 110z along an outer upper surface edge thereof extending in the third direction, and the susceptor cover 114a may be positioned inward from the protruding portion 110z, such that the protruding portion 110z and the susceptor cover 114a overlap in the radial or first and second directions, but not in the third direction. However, in the embodiment of FIG. 4, the entire upper surface of the susceptor 110a may be planar such that the susceptor cover 114 may correspond to the entire upper surface of the susceptor cover 114b, e.g., may completely overlap the upper surface in the third direction. In this case, the entire upper surface of the susceptor 110a may be protected from a deposition material by the susceptor cover 114b, so that more effective particle management may be ensured.

Figure 4B:
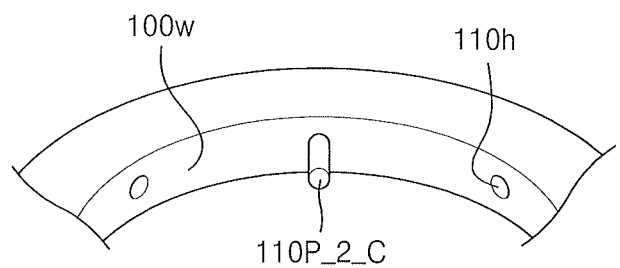
FIGS. 4B to 4E illustrate partial perspective views of support protrusions having different shapes, according to embodiments.
Figure 4C:
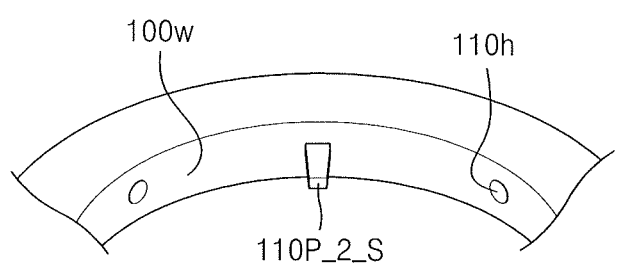
Figure 4D:
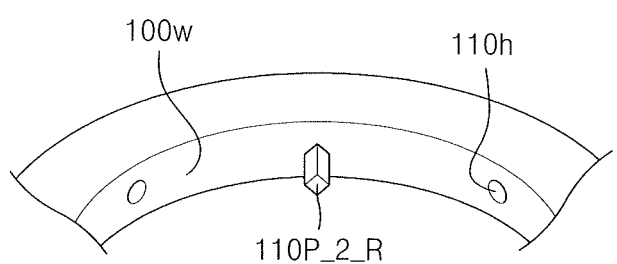
Figure 4E:
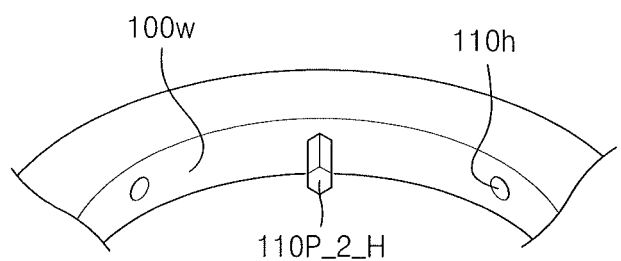

FIGS. 4B to 4E are partial perspective views illustrating support protrusions 110P_2_C, 110P_2_S, 110P_2_R, and 110P_2_H having different shapes, according to embodiments. Referring to FIG. 4B, the support protrusion 110P_2_C may have a pillar shape having a circular cross-section. Referring to FIG. 4C, the support protrusion 110P_2_S may have a pillar shape having a rectangular or square cross-section. Referring to FIG. 4D, the support protrusion 110P_2_R may have a pillar shape having a lozenge-shaped or rhomboid cross-section. Referring to FIG. 4E, the support protrusion 110P_2_H may have a pillar shape having a hexagonal cross-section. It will be understood by one of skill in the art that support protrusions in pillar shape having any other cross-sectional shapes, in addition to those illustrated in FIGS. 4B to 4E, e.g., an oval cross-sectional shape or a triangular cross-sectional shape.

The support protrusion 110P_2_S of FIG. 4C may have surface contact with the growth substrate 1 supported by the same, while the support protrusions 110P_2_C, 110P_2_R, and 110P_2_H of FIGS. 4B, 4D, and 4E may have line contact with the growth substrate 1 supported by the same. When the growth substrate 1 has line contact with support protrusions, the growth substrate 1 may be more rapidly and completely removed by etching, compared to having surface contact with support protrusions.

In some embodiments, the support protrusions 110P_2_C, 110P_2_R, and 110P_2_H of FIGS. 4B, 4D, and 4E may be provided such that end portions of the support protrusions 110P_2_C, 110P_2_R, and 110P_2_H that face the center of the center hole CH slant upward at a predetermined angle. When the support protrusions 110P_2_C, 110P_2_R, and 110P_2_H slant upward at a predetermined angle, the growth substrate 1 may have point contact with the support protrusions 110P_2_C, 110P_2_R, and 110P_2_H, so that the growth substrate 1 may be more rapidly and completely removed by etching.

Therefore, a large-size substrate without melt-back or cracking may be manufactured using a substrate manufacturing apparatus according to any of the above-described embodiments.

Figure 5:
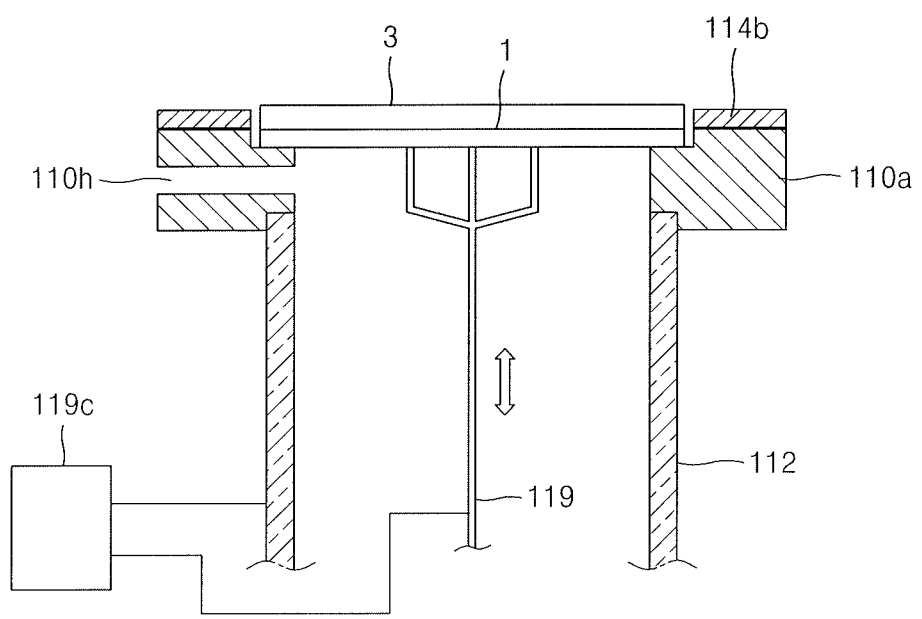
FIG. 5 illustrates a vertical cross-sectional view of a constitution of an inner liner and a susceptor, according to another embodiment.

FIG. 5 is a vertical cross-sectional view illustrating a constitution of an inner liner 112 and a susceptor 110a, according to another embodiment. Referring to FIG. 5, a lifting support 119 for moving the growth substrate 1 upward from the susceptor 110a may be provided inside the inner liner 112. The lifting support 119 may be movable upward and downward relative to the inner liner 112. e.g., along the third direction.

In some embodiments, as the lifting support 119 is moved upwards, the growth substrate 1 may be raised from the susceptor 110a. In some embodiments, instead of that the lifting support 119 is moved upward, the inner liner 112 may be moved downward, so that the growth substrate 1 may be lifted upward from the susceptor 110a.

An end of the lifting support 119 that contacts the growth substrate 1 may include three or more branched end portions. Although the lifting support 119 having branched end portions to support the growth substrate 1 is illustrated in the embodiment of FIG. 5, the end of the lifting support 119 may have any other shape, e.g., a disc-like shape to support the growth substrate 1.

When the growth substrate 1 is moved upward from the susceptor 110a, rotated at an a predetermined angle, and then moved downward back onto the susceptor 110a by the lifting support 119, the portions of the growth substrate 1 covered by the support protrusions 110P_2_C, 110P_2_S, 110P_2_R, and 110P_2_H of FIGS. 4A to 4E may be exposed to an etch gas. Accordingly, the lifting support 119 and/or the susceptor 110a may be constituted rotatable.

In some embodiments, the lifting support 119 may be raised to move the growth substrate 1 above from the susceptor 110a, rotated at a predetermined angle, and then moved downward such that the growth substrate 1 is supported again by the susceptor 110a.

In some other embodiments, after the lifting support 119 is raised to move the growth substrate 1 above from the susceptor 110a, the susceptor 110a and the inner liner 112 may be rotated at a predetermined angle, and then the lifting support 119 may be moved downward such that the growth substrate 1 is supported by the susceptor 110a.

In some other embodiments, after the susceptor 110a and the inner liner 112 are moved downward to separate the growth substrate 1 above from the susceptor 110a, the lifting support 119 may be rotated at a predetermined angle, and then the susceptor 110a and the inner liner 112 may be moved upward such that the growth substrate 1 is supported by the susceptor 110a.

In some other embodiments, after the susceptor 110a and the inner liner 112 are moved downward to separate the growth substrate 1 above from the susceptor 110a, the susceptor 110a and the inner liner 112 may be rotated at a predetermined angle, and then the susceptor 110a and the inner liner 112 may be moved upward such that the growth substrate 1 is supported by the susceptor 110a.

The moving of the lifting support 119 and/or the susceptor 110a upward and downward, and the moving of the inner liner 112 upward and downward may be repeated at a predetermined time interval.

Although in the above-described embodiments, the lifting support 119 may be moved upward and downward, or the susceptor 110a and the inner liner 112 may be moved upward and downward, it will be understood by one of ordinary skill in the art that the lifting support 119, the susceptor 110a, and the inner liner 112 can be configured to independently move upward and downward to lift the growth substrate 1 from the susceptor 110a.

The upward and downward movement and the rotation may be controlled by a lifting support controller 119C. It will be understood by one of ordinary skill in the art that the rotation and upward and downward movement of the lifting support 119 and the rotation and upward and downward movement of the susceptor 110a and the inner liner 112 may be controlled using an appropriate control method and an actuator.

Figure 6A:
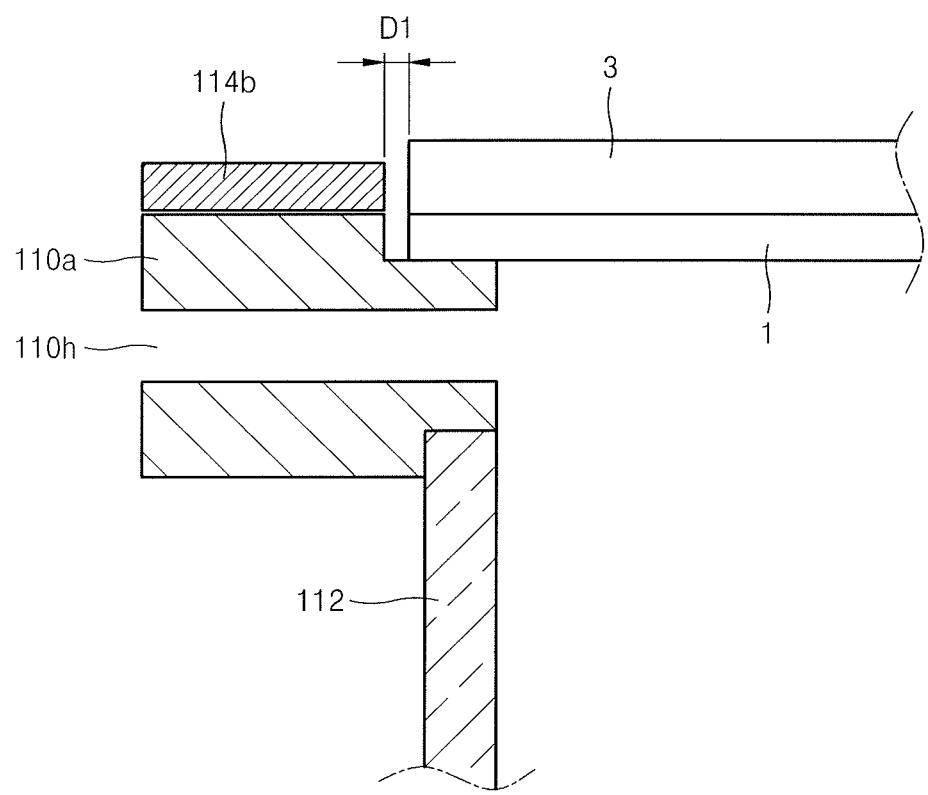
FIGS. 6A and 6B illustrate partial vertical cross-sectional views of shapes of susceptor covers and the shapes of target material layers corresponding to the shapes of the susceptor covers, according to embodiments.
Figure 6B:
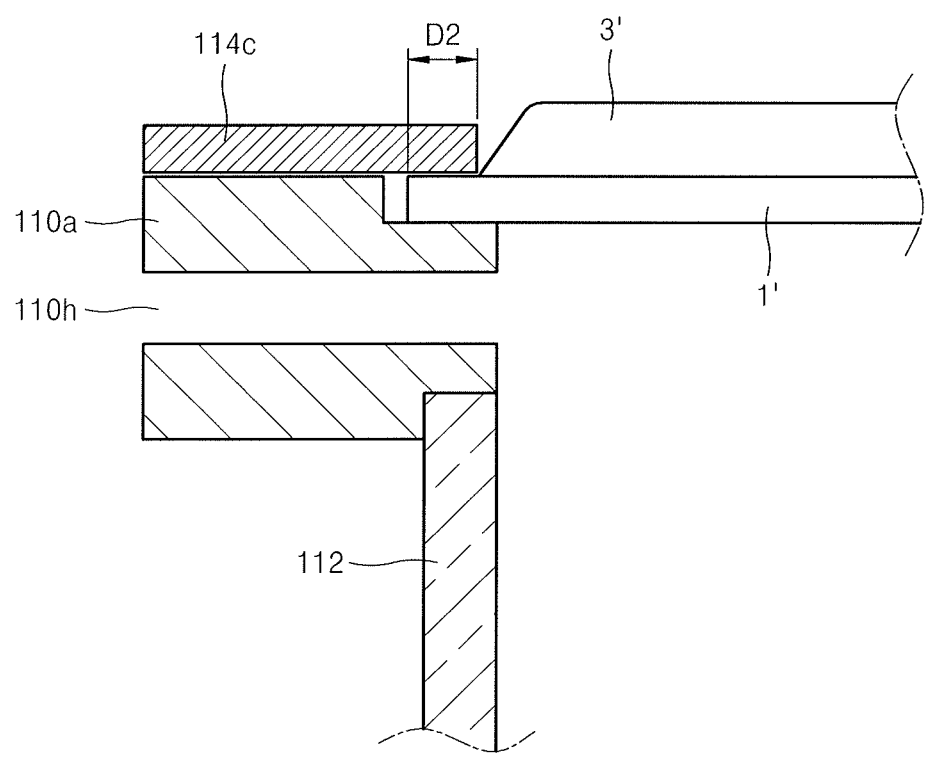

FIGS. 6A and 6B are partial vertical cross-sectional views illustrating shapes of the susceptor covers 114b and 114c and the shapes of the target material layers 3 and 3' corresponding to the shapes of the susceptor covers 114b and 114c, according to embodiments.

Referring to FIG. 6A, the susceptor cover 114b may not overlap the growth substrate 1 along the third direction. That is, the entire upper surface of the growth substrate 1 may be exposed by the susceptor cover 114b, and the target material layer 3 may be formed on the exposed upper surface of the growth substrate 1. When an inner diameter of the susceptor cover 114b is larger than a diameter of the growth substrate 1 may be referred to as a cover-out constitution.

However, when a gap distance D1 between the outer edge of the growth substrate 1 and an inner edge of the susceptor cover 114b along the first direction is too large, an etching product gas may leak through the gap distance D1 between the outer edge of the growth substrate 1 and the inner edge of the susceptor cover 114b.

The etching product gas may include a small amount of the etch gas remaining unreacted, so that the etch gas may leak through the gap distance D1, reach the surface of the target material layer 3 by diffusion or convection, and thus etch the surface of the target material layer 3. This may damage the surface of the target material layer 3 and is undesirable. Accordingly, to prevent such leakage of the etching product gas, the gap distance D1 between the outer edge of the growth substrate 1 and the inner edge of the susceptor cover 114b may be about 5 mm or less.

Referring to FIG. 6B, the susceptor cover 114c may overlap the growth substrate 1 along the third direction. That is, an upper surface portion of the growth substrate 1 except for the edge region of the growth substrate 1 may be exposed by the susceptor cover 114c, and the target material layer 3' may be formed on the exposed upper surface portion of the growth substrate 1. When an inner diameter of the susceptor cover 114c is smaller than a diameter of the growth substrate 1 may be referred to as a cover-in constitution.

When the edge region of the growth substrate 1 is covered by the susceptor cover 114c, etching of the target material layer 3' may be prevented or substantially minimized due to the leakage of the etching product gas. However, the deposition reaction near the inner edge of the susceptor cover 114c may be relatively insufficient, thereby affecting etching of the target material layer 3' such that the target material layer 3' has a slanted edge as illustrated in FIG. 6B.

In other words, when an overlapping portion between the susceptor cover 114c and the growth substrate 1 is too wide, an effective area of the target material layer 3' may be considerably reduced. To obtain a sufficient effective area of the target material layer 3', a width D2 of the overlapping portion between the susceptor cover 114c and the growth substrate 1 along the first direction may be reduced, e.g., to about 5 mm or less.

Figure 7A:
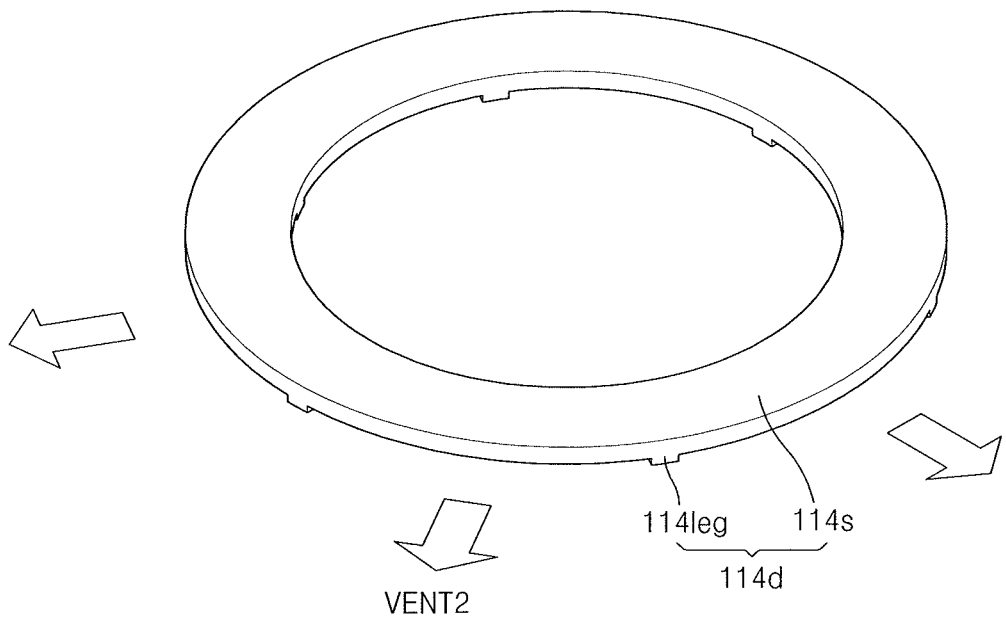
FIG. 7A illustrates a perspective view of a susceptor cover according to another embodiment.
Figure 7B:
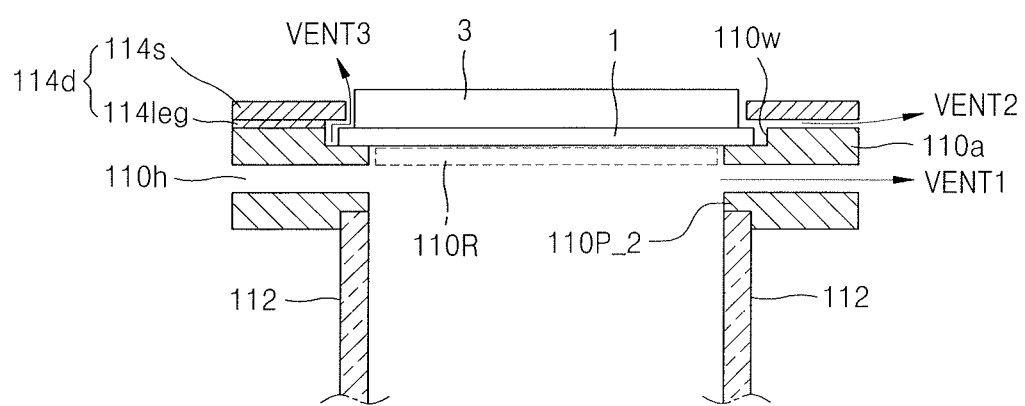
FIG. 7B illustrates a vertical cross-sectional view conceptually of an etching section when using the susceptor cover of FIG. 7A.

FIG. 7A is a perspective view of a susceptor cover 114d according to another embodiment. FIG. 7B is a vertical cross-sectional view conceptually illustrating an etching section when using the susceptor cover 114d of FIG. 7A.

Referring to FIGS. 7A and 7B, the susceptor cover 114d may have a flat portion 114s as a main body, and leg portions 114leg having a predetermined thickness that extend in the third direction on a lower surface of the flat portion 114s and spaced in a radial direction, e.g., regularly spaced.

When the susceptor cover 114d is placed on the susceptor 110a, the leg portions 114leg may support the flat portion 114a, while every adjacent two of the leg portions 114leg may form a space between the flat portion 114s and the susceptor 110a.

An etching product gas may be discharged through the outlet ports 110h (VENT1). When using the susceptor cover 114d, an etching product gas may be more rapidly discharged through the outlet ports 110h (VENT1) and the spaces between the flat portion 114s and the susceptor 110a (VENT2).

Due to the rapid discharging of the etching product gas through the routes designated by VENT1 and VENT2 in FIG. 7B, the discharge VENT3 of the etch gas product through a gap space between the outer edge of the growth substrate 1 and the inner edge of the susceptor cover 114b may be remarkably reduced, so that quality deterioration of the target material layer 3 may be significantly reduced.

Figure 8:
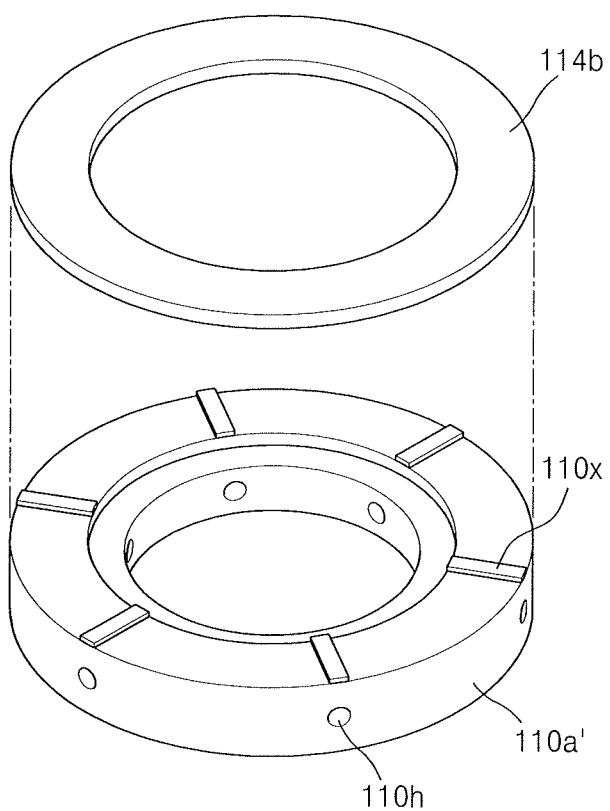
FIG. 8 illustrates an exploded perspective view conceptually of coupling of a susceptor and the susceptor cover, according to an embodiment.

FIG. 8 is an exploded perspective view conceptually illustrating coupling of a susceptor 110a' according to an embodiment and the susceptor cover 114b. Referring to FIG. 8, the susceptor 110a' may have a plurality of support bumps 110x, as protrusions corresponding to the leg portions 114leg of FIGS. 7A and 7B, on an upper surface thereof. Accordingly, the leg portions 114leg of the susceptor cover 114 may be unnecessary. The susceptor cover 114 b may be aligned with corresponding support bump 110x to provide an additional gap space along the third direction, or may be spaced apart along the circumference from the support bump 110x to further divide the gaps space. Effects from the susceptor 110a' of FIG. 8 may be substantially the same as those from the embodiment described with reference to FIGS. 7A and 7B, and thus a redundant description thereof will be omitted.

Figure 9A:
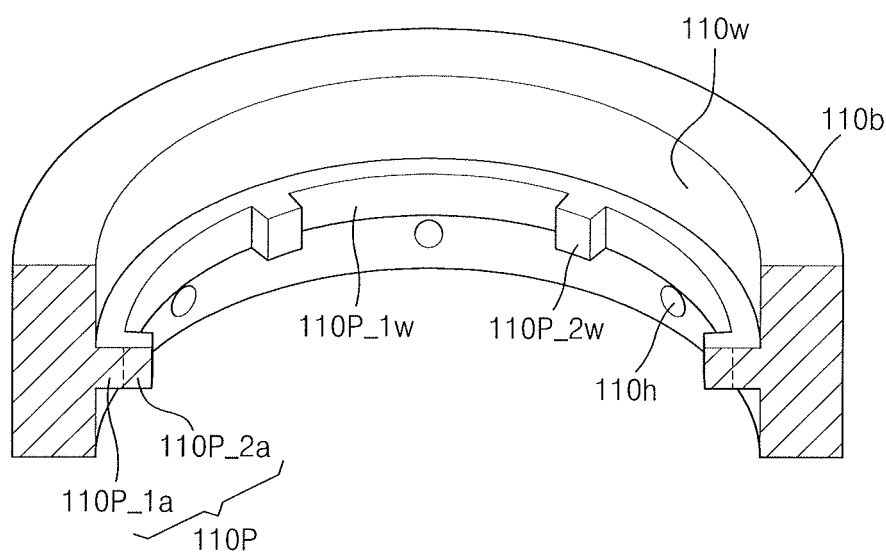
FIG. 9A illustrates a perspective cross-sectional view illustrating a structure of a susceptor according to another embodiment.
Figure 9B:
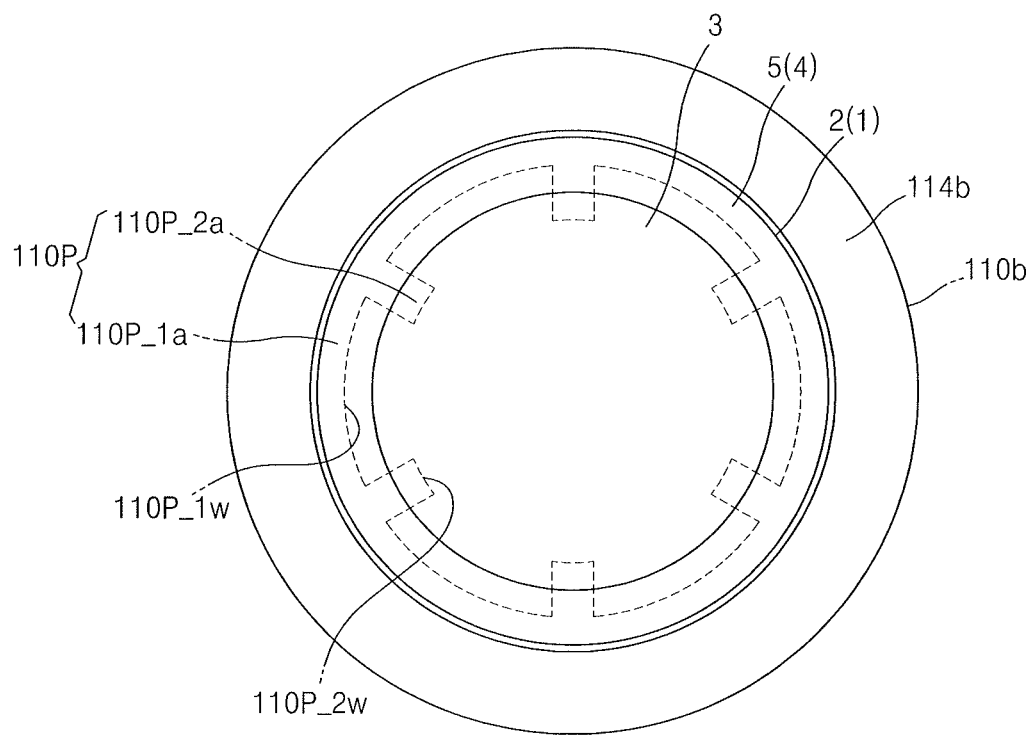
FIG. 9B illustrates a plan view of that a target material layer is formed on a growth substrate supported on the susceptor of FIG. 9A.
Figure 9C:
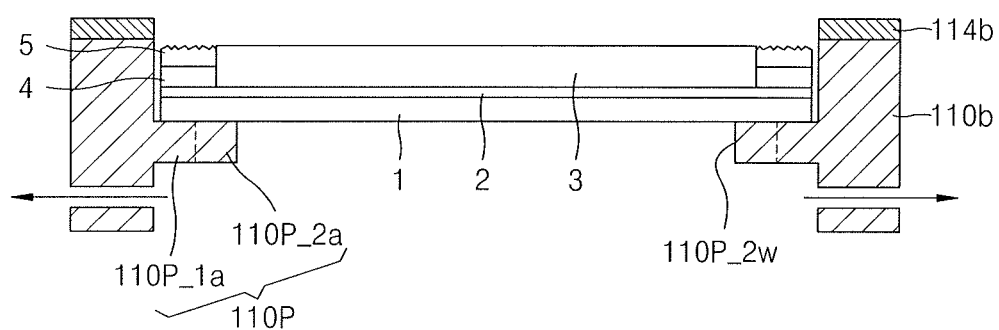
FIGS. 9C and 9D illustrate vertical cross-sectional views of change resulting from removing the growth substrate by etching.
Figure 9D:
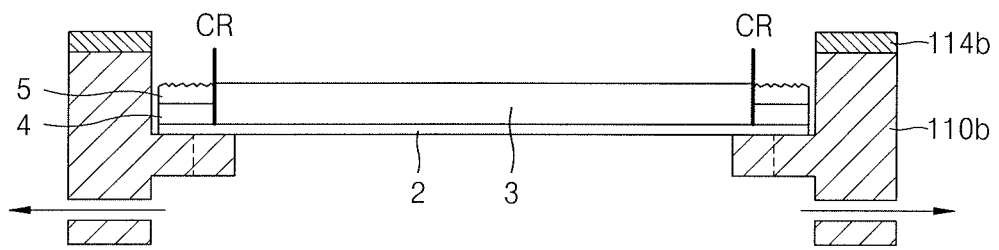

FIG. 9A is a perspective cross-sectional view illustrating a structure of a susceptor 110b according to another embodiment. FIG. 9B is a plan view illustrating that a target material layer 3 is formed on a growth substrate 1 supported on the susceptor 110b of FIG. 9A. FIGS. 9C and 9D are vertical cross-sectional views illustrating change resulting from removing the growth substrate 1 by etching.

Referring to FIG. 9A, the susceptor 110b may have a support protrusion 110P on an inner sidewall of the susceptor 110b. The support protrusion 110P may include a first portion 110P_1a that protrudes from the inner sidewall 110w along the circumference of the inner sidewall 110w, and second portions 110P_2a in a pillar shape extending intermittently from the first portion 110P_1a toward the center hole CH.

The first portion 110P_1a may have a first portion sidewall 110P_1w, and the second portions 110P_2a may each have a second portion sidewall 110P_2w. The growth substrate 1 may be placed on the support protrusion 110P.

Hereinafter, embodiments of growing a substrate having a predetermined structure free of melt-back will be described. First, a structure of layers that may be grown on a growth substrate 1 will be described.

Referring to FIG. 9C, a buffer layer 2 may be formed on the growth substrate 1. A material for forming the buffer layer 2, a method and purpose of forming the buffer layer 2, and the size thereof are described above in the embodiment described with reference to FIG. 1, and thus a detailed description thereof will be omitted.

An insulating layer having a predetermined thickness may be formed on the buffer layer 2. The insulating layer may be formed using chemical vapor deposition (CVD), sputtering, or an evaporation method. The insulating layer may have a thickness of about several nanometers (nm) to tens of micrometers (μm). The insulating layer may be formed of silicon oxide, silicon nitride, alumina, hafnium, or the like.

The insulating layer may be patterned by photolithography to form an insulating layer pattern 4 in an upper surface edge region of the buffer layer 2. The insulating layer pattern 4 may have an annular shape. The patterning of the insulating layer may be performed by wet etching or dry etching. The insulating layer pattern 4 may have a width of about 0.5 mm to about 5 mm. The insulating layer pattern 4 may be formed to cover a crack in the upper surface edge region of the buffer layer 2.

A target material layer 3, e.g., a GaN layer may be grown on the buffer layer 2 by using a hydride vapor phase epitaxy (HVPE) method. The growth rate of GaN may be faster when using the HVPE method, compared to a metal-organic chemical vapor deposition (MOCVD) method. Accordingly, the HVPE method may be used to efficiently grow a large-area, thick GaN layer. After gallium chloride (GaCl) is formed by reaction with hydrogen chloride (HCl) and Ga metal in a HVPE reactor, GaCl may react with NH₃ to grow a GaN layer as the target material layer 3 on the buffer layer 2.

The growth temperature of the target material layer 3 may be from about 950° C. to about 1100° C. The target material layer 3 may have a thickness of about 5 μm to about 2 mm.

When using the HVPE method, the target material layer 3 (hereinafter, also referred to as monocrystalline target material layer 3), for example, a monocrystalline GaN layer, may be grown on the buffer layer 2, and a polycrystalline material layer 5, for example, a polycrystalline GaN layer, may be grown on the insulating layer pattern 4.

The monocrystalline target material layer 3 and the polycrystalline material layer 5 may be easily delaminated from one another. The polycrystalline material layer 5 may be easily separated from the monocrystalline target material layer 3. The polycrystalline material layer 5 on the insulating layer pattern 4 and a corresponding portion of the buffer layer 2 under the insulating layer pattern 4 may be easily separated.

Referring to FIGS. 9B and 9C, an inner edge of the insulating layer pattern 4, in other words, the boundary between the monocrystalline target material layer 3 and the polycrystalline material layer 5 may be on the second portions 110P_2a of the support protrusion 110P. Accordingly, after the polycrystalline material layer 5 is separated from the monocrystalline target material layer 3 as described above, the monocrystalline target material layer 3 may still be supported by the second portions 110P_2a.

As illustrated in FIG. 9B, since the growth substrate 1 contacts the first portion 110P_1a of the support protrusion 110P along a circumferential direction, an etch gas for the growth substrate 1 may not leak toward the target material layer 3. Accordingly, an undamaged and good quality free-standing substrate may be obtained.

Referring to FIGS. 9C and 9D, when a target material layer is formed using, for example, a HVPE method while the growth substrate 1 having the buffer layer 2 and the insulating layer pattern 4 thereon is supported by the susceptor 110b, the polycrystalline material layer 5 may also be formed together with the monocrystalline target material layer 3.

At the same time or sequentially, the growth substrate 1 may be removed using an etch gas. The growth substrate 1 may be gradually removed using the etch gas until the growth substrate 1 is completely removed so that the buffer layer 2 remains as the lowermost layer as in FIG. 9D.

Then, separation of the monocrystalline target material layer 3 and the polycrystalline material layer 5 from one another may occur at the boundary therebetween, designated by "CR" in FIG. 9D, as described above. As a result, the monocrystalline target material layer 3 may remain as a single free-standing substrate supported by the second portions 110P_2a of the support protrusion 110P.

In general, the melt-back phenomenon, i.e., the diffusion of constituent elements of the growth substrate 1 through cracks in the buffer layer 2, may mainly occur in the edge region of the growth substrate 1. In an embodiment, the insulating layer pattern 4 may be formed in a region where such melt-back may frequently occur, and then be removed later, and consequentially a free-standing substrate with little to no melt-back may be obtained.

Figure 10:
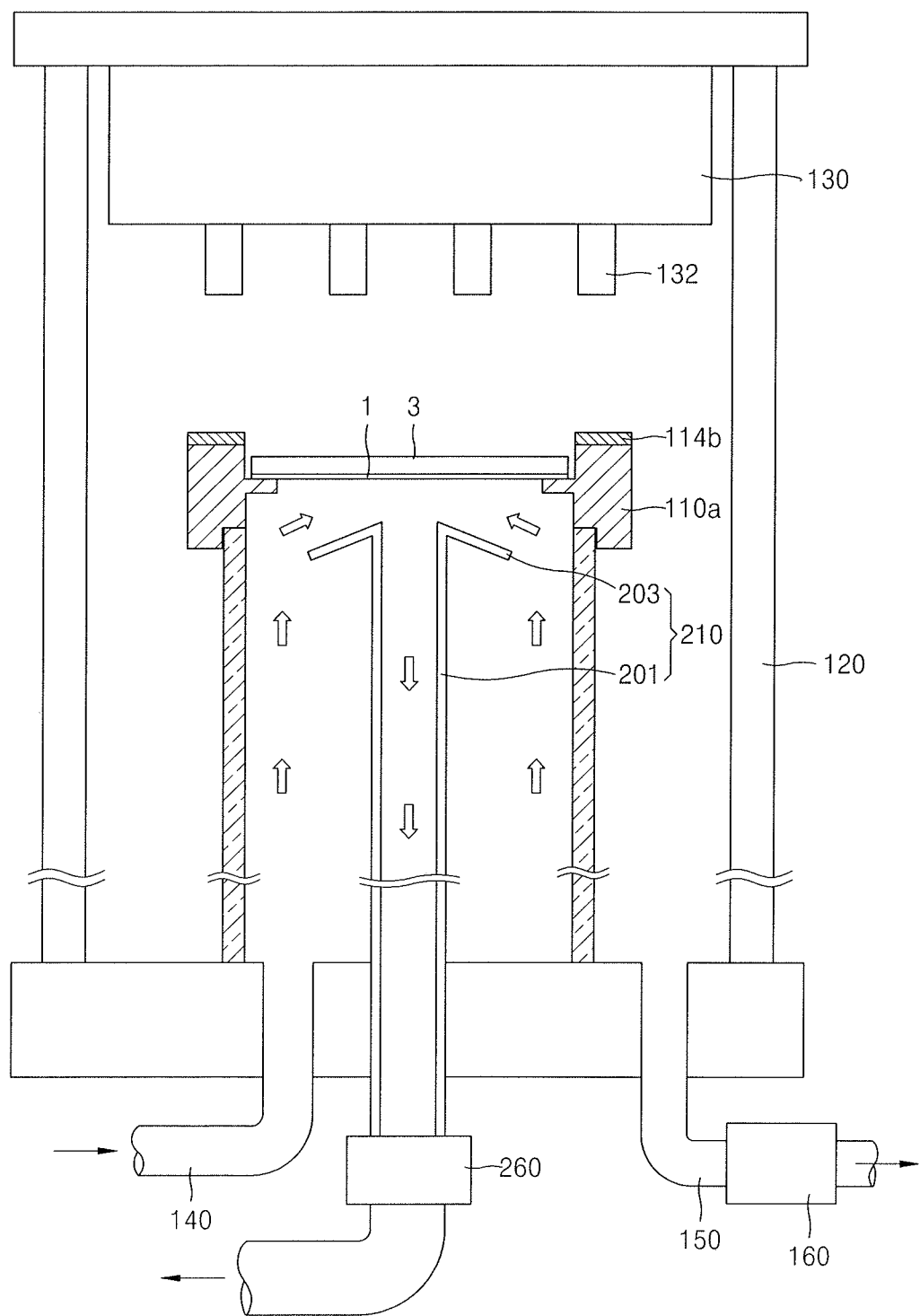
FIG. 10 illustrates a vertical cross-sectional view conceptually illustrating an apparatus of manufacturing a large-size substrate, according to another embodiment.

FIG. 10 is a vertical cross-sectional view conceptually illustrating a substrate manufacturing apparatus 200 of manufacturing a large-size substrate, according to another embodiment. The embodiment of FIG. 10 is similar to that of FIG. 1, except that the substrate manufacturing apparatus 200 may further include an exhaust tube 201 for discharging an etching product gas out of the inside of the inner liner 112. The embodiment of FIG. 10 will be described, focusing on the difference from the embodiment of FIG. 1.

Referring to FIG. 10, the exhaust tube 201 may be provided inside the inner liner 112. The exhaust tube 201 may collect an etching product gas and serve as a path for externally discharging the etching product gas.

A baffle plate 203 may be provided at an end of the exhaust tube 201 that faces a lower surface of the growth substrate 1. The baffle plate 203 may radially extend from the end of the exhaust tube 201. For example, the baffle plate 203 may be slanted downward such that the distance between the baffle plate 203 and the growth substrate 1 increases in a direction away from a central axis of the exhaust tube 201.

Such slanted arrangement of the baffle plate 203 is due to that etching related reactions are more active near the center of the growth substrate 1 and are relatively less active toward the edge region of the growth substrate 1.

The slant angle of the baffle plate 203 may be adjusted for other purposes. For example, the baffle plate 203 may be slanted upward such that the distance between the baffle plate 203 and the growth substrate 1 increases in a direction away from the central axis of the exhaust tube 201, if needed.

The etching product gas may be externally discharged through an exhaust pipe 210 including the baffle plate 203 and the exhaust tube 201. For example, the etching product gas may pass through a filter 260 for capturing solid foreign materials such as particles which may be in the etching product gas.

In the embodiment of FIG. 1, the etching product gas may pass through the filter 160 together with a gas discharged from the deposition section, so that the filter 150 may have a relatively short maintenance interval. However, in the embodiment of FIG. 10, the etching product gas and a gas discharged from the deposition section may separately pass through the filters 260 and 160, respectively, so that the filters 260 and 160 may have a relatively long maintenance interval.

Figure 11:
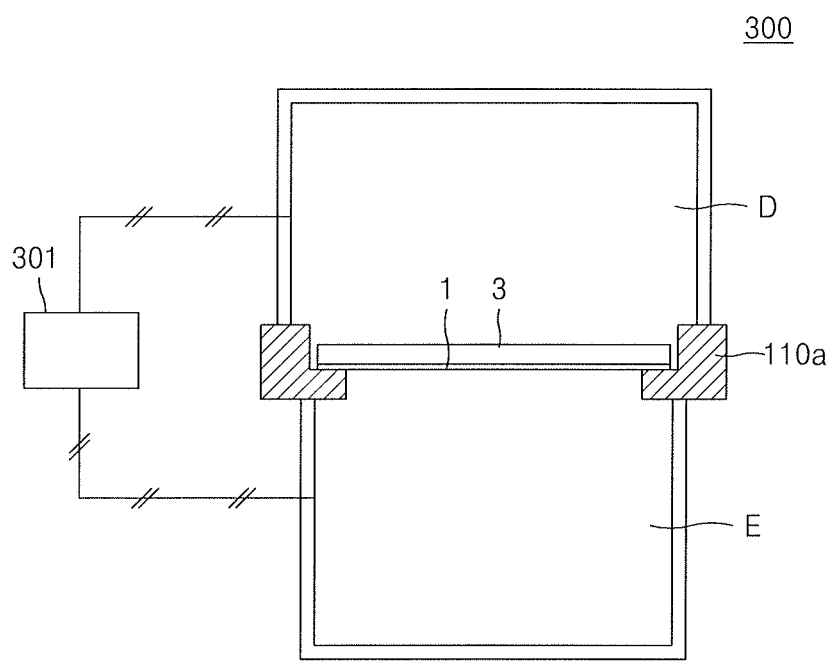
FIG. 11 illustrates a schematic view conceptually of an apparatus of manufacturing a free-standing substrate, according to another embodiment.

FIG. 11 is a schematic view conceptually illustrating a free-standing substrate manufacturing apparatus 300 according to another embodiment. Referring to FIG. 11, the free-standing substrate manufacturing apparatus 300 may roughly be separated into two sections, i.e., a deposition section D in which a material layer may be deposited on a substrate supported on a susceptor 11a, and an etching section E in which the substrate supported on the susceptor 110a may be removed in situ.

The etching section E may correspond to the space defined by the inner liner 112 and the susceptor 110 (110a, 110b) in FIGS. 1 and 10. The deposition section D may correspond to the inner space of the deposition chamber housing 120 in FIGS. 1 and 10. i.e., the space outside the inner liner 112. FIG. 11 is a conceptual illustration of the etching section E and the deposition section D, and thus the shapes thereof as illustrated in FIG. 11 may appear different from those illustrated in FIGS. 1 and 10.

A susceptor 110a as a support for the growth substrate 1 may be provided between the etching section E and the deposition section D. That is, the growth substrate 1 supported on the susceptor 110a may separate the etching section E and the deposition section D from one another. A material layer, for example, a GaN material layer may be deposited on a surface of the growth substrate D opposite to the deposition section D, and the other surface of the growth substrate 1 opposite to the etching section E may be subjected to etching.

These processes may be performed by a controller 301 connected to both the etching section E and the deposition section D. In some embodiments, etching in the etching section E and deposition in the deposition section D may each substantially independently be performed. In some embodiments, etching in the etching section E and deposition in the deposition section D may each substantially independently be performed, except that the onset of deposition in the deposition section D precedes the onset of etching in the etching section E.

Figure 12:
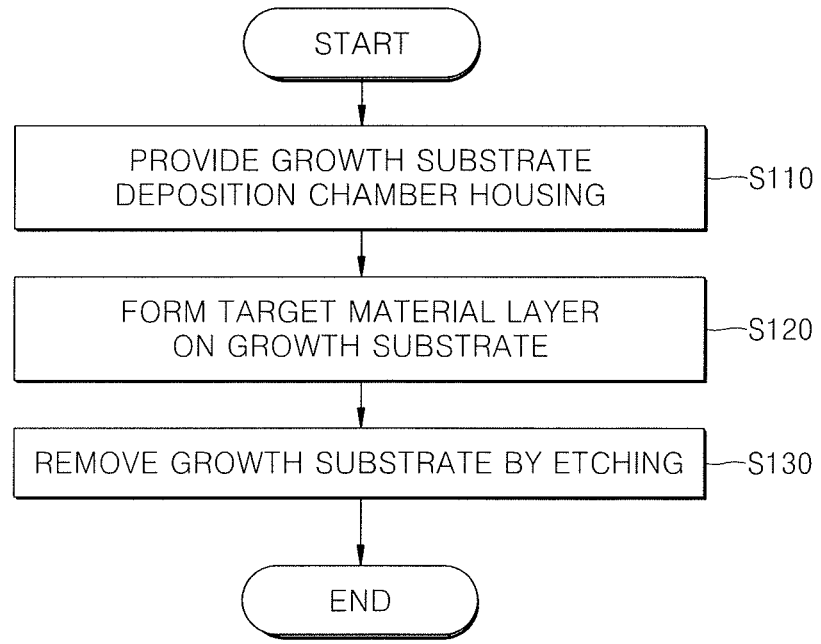
FIG. 12 illustrates a flowchart of a method of manufacturing a free-standing substrate, according to an embodiment.

FIG. 12 is a flowchart of a method of manufacturing a free-standing substrate, according to an embodiment.

Referring to FIG. 12, a growth substrate may be provided in a deposition chamber housing (S110). For example, as described above with reference to FIG. 1, a growth substrate 1 may be provided in the deposition chamber housing 120, and in particular, on the susceptor 110 in the deposition chamber housing 120. The growth substrate 1 may serve as a base for manufacturing a target free-standing substrate such as a GaN substrate.

Subsequently, a target material layer may be formed on the growth substrate (S120). For example, as described above with reference to FIG. 1, the target material layer 3 may be formed on the growth substrate 1 by, for example, a HVPE method. The target material layer 3 may be, for example, a GaN material layer. Details of this process are described above with reference to FIG. 1, and thus a redundant description thereof will be omitted.

The growth substrate 1 may be removed by etching (S130). In the flowchart of FIG. 12, the forming of the target material layer 3 on the growth substrate 1 (S120) is followed by the removing of the growth substrate 1 by etching (S130). However, the removal of the growth substrate 1 by etching (S130) may be performed prior to the end of the forming the target material layer 3 (S120). This will be described in greater detail with reference to FIGS. 13A to 13C.

Figure 13A:
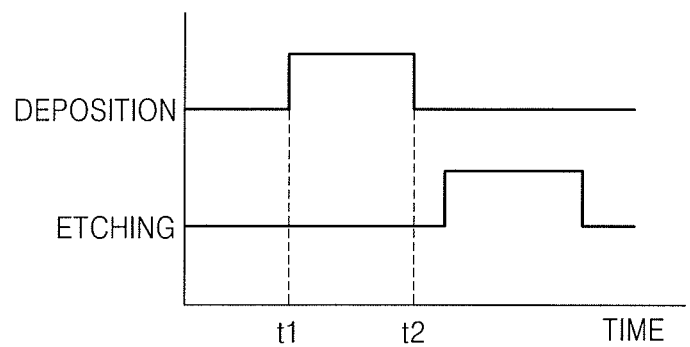
FIGS. 13A to 13C illustrate timing diagrams of the temporal order of forming a target material layer on a growth substrate and removing the growth substrate by etching.
Figure 13B:
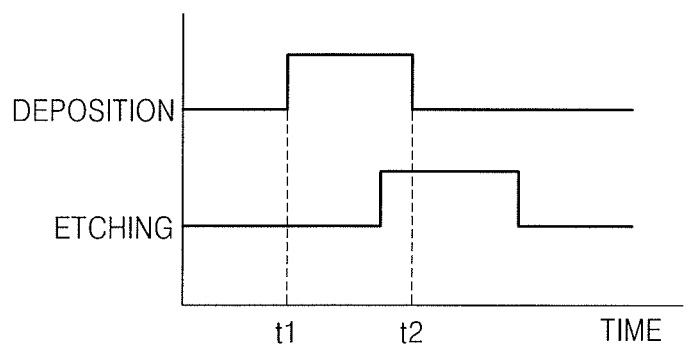
Figure 13C:
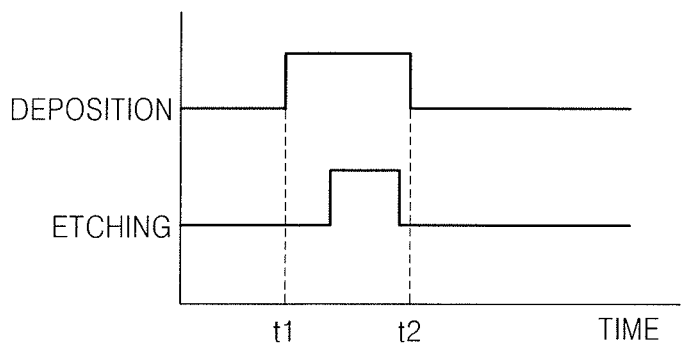

FIGS. 13A to 13C are timing diagrams illustrating the temporal order of the forming the target material layer 3 on the growth substrate 1 by "deposition" (S120) and the removing the growth substrate 1 by "etching" (S130).

Referring to FIG. 13A, the deposition process may start at time t1 and end at time t2. The etching process may start after time t2 and end after the etching of the growth substrate 1 for a predetermined period of time is complete. In other words, the timing diagram of FIG. 13A is the case where removing of the growth substrate 1 starts after the formation of the target material layer 3 is complete.

Referring to FIG. 13B, the deposition process may start at time t1 and end at time t2. The etching process may start prior to the end of the deposition process and end after a predetermined period of time from the end of the deposition process at time t2. In other words, the timing diagram of FIG. 13B is the case where removing the growth substrate 1 starts before the formation of the target material layer 3 is complete and ends after a predetermined period of time from the end of the formation of the target material layer 3.

Referring to FIG. 13C, as in the embodiments described above, the deposition process may start at time t1 and end at time t2. The etching process may start after the start of the deposition process and end prior to the end of the deposition process at time t2. The timing diagram of FIG. 13C is the case where the etching of the growth substrate 1 starts and ends before the formation of the target material layer 3 is complete. In other words, removing the growth substrate 1 supporting the target material layer 2 may be started when the target material layer 2 is formed partly, and may be completed before the formation of the target material layer 3 is complete.

As described above, it may be not necessary to remove the growth substrate 1 by etching (S130) after the forming of the target material layer 3 (S120) is complete, as long as the onset of etching the growth substrate 1 is after time t1, so that the target material layer 2 may be formed at least partly before removal starts.

FIG. 14 is a flowchart of a method of manufacturing a free-standing substrate, according to another embodiment. Referring to FIG. 14, a first substrate may be provided in a deposition chamber housing (S210). The first substrate may correspond to the growth substrate 1 described above with reference to FIG. 12, and thus a redundant description thereof will be omitted.

Subsequently, a second substrate material layer may be formed on the first substrate (S220). The second substrate material layer may be a material layer as a medium that facilitates epitaxial growth with a low defect density between the first substrate and a third substrate material layer that is to be formed later on the second substrate material layer. In some embodiments, the material of the second substrate material layer may be selected to have a lattice constant that is between those of the first substrate and the third substrate material layer. In some embodiments, when the third substrate material layer is a GaN material layer, the second substrate material layer may be, for example, a AlN, AlGaN, or InGaN layer.

Next, a third substrate material layer may be formed on the second substrate material layer (S230). The third substrate material layer may correspond to the target material layer 3 described above with reference to FIG. 12, and thus a redundant description thereof will be omitted.

Next, the first substrate may be removed by etching (S240). The removing of the first substrate is described above with reference to FIG. 12, and thus a redundant description thereof will be omitted.

Next, the second substrate material layer may be removed by etching (S250). The removing of the second substrate material layer by etching may be performed using substantially the same method as used with the first substrate. For example, the second substrate material layer may be removed by contacting an exposed surface of the second substrate material layer with an etch gas, for example, a $Cl_2$ gas and/or HCl gas.

As in the embodiment described above with reference to FIG. 12, operations S210 to S250 of FIG. 14 may be performed in different orders. For example, although the flowchart of FIG. 14 illustrates that a free-standing substrate may be manufactured by providing a first substrate, then forming a second substrate material layer, then forming a third substrate material layer, then removing the first substrate, and then removing the second substrate material layer, a free-standing substrate may also be manufactured by providing a first substrate, then forming a second substrate material layer, then removing the first substrate, then forming a third substrate material layer, and then removing the second substrate material layer. In addition, two or more operations S210 to S250 may temporally overlap with one another, e.g., may be performed at least partially simultaneously.

By way of summation and review, one or more embodiments may provide an apparatus and method for manufacturing a large-size substrate without melt-back or cracking. One or more embodiments may provide an apparatus and method for manufacturing a free-standing large-size substrate without melt-back or cracking. In particular, one or more embodiments may remove a first substrate, e.g., a growth substrate, on which a second substrate, e.g., a target material, is deposited by exposing a surface of the first substrate, opposite a surface on which the second substrate is deposited, to an etch gas. The removal may be during and/or after the depositing.

The controllers of the embodiments described herein may be implemented in logic, which, for example, may include hardware, software, or both. When implemented at least partially in hardware, the controllers may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers may include, for example, a memory or other storage device for storing code or instructions to be executed, for example, by a computer, processor, microprocessor, controller, or other signal processing device. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An apparatus for manufacturing a substrate, the apparatus comprising:
   a deposition chamber housing that accommodates a growth substrate;
   a first supply to supply a deposition gas into the deposition chamber housing to form a deposition atmosphere for forming a target substrate on a front surface of the growth substrate;
   a second supply to supply an etch gas, which is reactive with the growth substrate and different from the deposition gas, to form an etching atmosphere at a rear surface of the growth substrate, wherein the second supply operates to initiate supply of the etch gas to the rear surface of the growth substrate after the first supply initiates supply of the deposition gas to the front surface of the growth substrate;
   a susceptor to support the growth substrate and expose the rear surface of the growth substrate;
   a controller configured to control the first supply and the second supply so that the growth substrate initiates to be etched after the target substrate initiates to be formed and timing of supply of the deposition gas and the supply of the etch gas at least partially overlap;
   an inner liner connected to the susceptor so as to isolate the etch gas from the deposition gas and separate the etching atmosphere located inside a boundary established by the inner liner from the deposition atmosphere located outside the inner liner,
   wherein the inner liner is to guide the etch gas towards the rear surface of the growth substrate, and
   wherein the susceptor includes:
      a center hole to expose the rear surface of the growth substrate, and
      a support protrusion supporting the growth substrate, the support protrusion protruding toward the center of the center hole from an inner sidewall of the susceptor defining the center hole.

2. The apparatus as claimed in claim 1, wherein the support protrusion protrudes from the inner sidewall and extends along a circumference of the inner sidewall.

3. The apparatus as claimed in claim 1, wherein the support protrusion includes pillar-shaped protrusions extending from the inner sidewall toward the center of the center hole.

4. The apparatus as claimed in claim 1, wherein the susceptor includes an outlet port for discharging an etching product gas from an inner area defined by the inner liner, the etching product gas being a gas resulting from etching the growth substrate.

5. The apparatus as claimed in claim 4, wherein the outlet port extends through the susceptor, from the inner sidewall of the susceptor to an outer sidewall of the susceptor.

6. The apparatus as claimed in claim 5, wherein the susceptor includes a plurality of outlet ports arranged along a circumference of the susceptor.

7. The apparatus as claimed in claim 1, further comprising a susceptor cover at least partially covering an upper surface of the susceptor,
   wherein the susceptor cover exposes an upper surface of the growth substrate, and a gap between an inner edge of the susceptor cover and an outer edge of the growth substrate is about 5 mm or less.

8. The apparatus as claimed in claim 1, further comprising:
   a lifting support that supports the growth substrate through the center hole of the susceptor;
   a vertical motion unit that moves the lifting support in a vertical direction with respect to the inner liner; and
   a rotation unit that rotates the lifting support with respect to the inner liner.

9. The apparatus as claimed in claim 1, wherein the support protrusion includes:
   a first portion protruding from the inner sidewall and extending along the circumference of the inner sidewall; and
   second portions extending in a pillar shape from the first portion toward the center of the center hole.

10. The apparatus as claimed in claim 9, wherein the growth substrate has an insulating layer pattern having a width along an edge region of an upper surface of the growth substrate, and an inner edge of the insulating layer pattern is located on the second portions of the support protrusion.

11. The apparatus as claimed in claim 1, further comprising an exhaust tube in the inner liner to discharge an etching product gas from an inner area defined by the inner liner, the etching product gas being a gas resulting from etching the growth substrate.

12. The apparatus as claimed in claim 11, wherein:
a central axis of the exhaust tube is oriented towards a center of the growth substrate, and
the exhaust tube includes a baffle plate located at and radially extending from an end of the exhaust tube, the baffle plate extending laterally from the central axis of the exhaust tube.

13. The apparatus as claimed in claim 12, wherein the baffle plate is slanted downward to have an increased distance from the growth substrate away from the central axis of the exhaust tube.

14. The apparatus as claimed in claim 1, wherein the growth substrate has a diameter of about 4 inches to about 18 inches.

15. An apparatus for manufacturing a substrate, the apparatus comprising:
a deposition section in which a deposition gas is supplied to deposit a second substrate material layer on a front surface of a first substrate that is disposed in the deposition section, the deposition section depositing the second substrate material layer at a deposition temperature;
an etching section in which an etch gas, which is reactive with the first substrate and different from the deposition gas, is supplied to a rear surface of the first substrate so as to remove the first substrate by etching;
a susceptor between the deposition section and the etching section, wherein the susceptor is to support the first substrate; and
a controller to control deposition of the second substrate material layer and etching of the first substrate,
wherein the controller is configured to initiate supply of the deposition gas to the front surface of the first substrate prior to initiating the supply the etching gas to the rear surface of the first substrate, and timing of supply of the deposition gas and the supply of the etching gas to at least partially overlap, and
wherein the temperature of the deposition section is maintained at the deposition temperature while the etching gas is supplied to the rear surface of the first substrate.

16. An apparatus for manufacturing a substrate, the apparatus comprising:
a susceptor to support a first substrate, the susceptor exposing a front surface and a rear surface of the first substrate;
a deposition section in which a deposition gas is supplied to form a deposition atmosphere to deposit a second substrate material layer on the front surface of the first substrate;
an etching section in which an etch gas, which is reactive with the first substrate and different from the deposition gas, is supplied to form an etching atmosphere to remove the first substrate by etching the rear surface of the first substrate, wherein the etch gas is initially supplied to the rear surface of the first substrate after the deposition gas is initially supplied to the front surface of the first substrate; and
an isolation section coupled to the susceptor so as to isolate the etch gas from the deposition gas and separate the etching atmosphere located at the rear surface of the first substrate from the deposition atmosphere located at the front surface of the first substrate; and
a controller configured to control the deposition section and the etching section so that the supply of the etch gas initiates after the supply of the deposition gas initiates and timing of supply of the deposition gas and the supply of the etch gas at least partially overlap.

17. The apparatus as claimed in claim 16, wherein the support includes
a center hole to expose the rear surface of the first substrate, and
a support protrusion supporting the first substrate, the support protrusion protruding toward the center of the center hole from an inner sidewall of the support defining the center hole.

18. The apparatus as claimed in claim 17, wherein the support protrusion extends from an entire circumference of the center hole.

19. The apparatus as claimed in claim 17, wherein the support protrusion extends intermittently from a circumference of the center hole.

20. The apparatus as claimed in claim 17, wherein the support protrusion is about 25% or less than a total area of the center hole plus the support protrusion.

* * * * *